(12) United States Patent
Worou

(10) Patent No.: US 10,281,500 B2
(45) Date of Patent: May 7, 2019

(54) DIGITALLY IMPLEMENTED RIPPLE DETECTOR

(71) Applicant: HAMILTON SUNDSTRAND CORPORATION, Charlotte, NC (US)

(72) Inventor: Albert Marius Worou, Belvidere, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 305 days.

(21) Appl. No.: 14/634,311

(22) Filed: Feb. 27, 2015

(65) Prior Publication Data

US 2016/0252549 A1 Sep. 1, 2016

(51) Int. Cl.
| | | |
|---|---|---|
| G01R 19/04 | (2006.01) | |
| G01R 19/25 | (2006.01) | |
| H02M 1/14 | (2006.01) | |
| H02M 7/04 | (2006.01) | |
| G01R 31/40 | (2014.01) | |
| H02M 1/00 | (2006.01) | |

(52) U.S. Cl.
CPC ......... *G01R 19/04* (2013.01); *G01R 19/2506* (2013.01); *H02M 1/14* (2013.01); *H02M 7/04* (2013.01); *G01R 31/40* (2013.01); *H02M 2001/0012* (2013.01)

(58) Field of Classification Search
CPC ...... G01R 19/04; G01R 19/175; G01R 19/25; G01R 19/2506; G01R 19/2513; G01R 31/40; H02M 1/14; H02M 1/143; H02M 1/15; H02M 7/04; H02M 2001/0012; H02P 6/10; H03M 1/0845

See application file for complete search history.

(56) References Cited

U.S. PATENT DOCUMENTS

| | | | | |
|---|---|---|---|---|
| 3,982,173 A | * | 9/1976 | Berry | G05F 1/575 323/236 |
| 6,697,270 B1 | | 2/2004 | Kalman | |
| 8,698,469 B1 | * | 4/2014 | Latham, II | H02M 1/15 323/283 |
| 2003/0012038 A1 | * | 1/2003 | Welches | H02M 1/126 363/34 |

(Continued)

FOREIGN PATENT DOCUMENTS

| | | |
|---|---|---|
| EP | 2109211 | 10/2009 |
| JP | 2011229224 | 11/2011 |

OTHER PUBLICATIONS

French Patent Office, French Search Report dated Apr. 17, 2018 in Application No. 1651295.

(Continued)

*Primary Examiner* — Huy Q Phan
*Assistant Examiner* — Dustin R Dickinson
(74) *Attorney, Agent, or Firm* — Snell & Wilmer L.L.P.

(57) ABSTRACT

What is described is a system for estimating a ripple component of an input signal. The system includes a first module configured to remove a direct current (DC) component from the input signal and output an alternating current (AC) signal that includes the ripple component and a low frequency component of the input signal. The system also includes a second module configured to determine a period and an amplitude of the AC signal and output an estimated ripple signal based on the period and the amplitude of the AC signal.

5 Claims, 6 Drawing Sheets

(56) References Cited

U.S. PATENT DOCUMENTS

| | | | | |
|---|---|---|---|---|
| 2007/0026829 A1* | 2/2007 | Kim | ............... | G11B 20/10009 |
| | | | | 455/232.1 |
| 2007/0165427 A1* | 7/2007 | McDonald | ............ | H02M 1/143 |
| | | | | 363/41 |
| 2011/0221271 A1* | 9/2011 | Bodnar | ............... | G06F 1/3209 |
| | | | | 307/31 |
| 2014/0077787 A1* | 3/2014 | Gorisse | ............... | H03F 1/0211 |
| | | | | 323/304 |
| 2014/0129892 A1* | 5/2014 | Magin | ................... | H04B 3/542 |
| | | | | 714/746 |
| 2014/0214343 A1* | 7/2014 | Bengtsson | ........... | H02H 7/1255 |
| | | | | 702/58 |
| 2014/0254217 A1* | 9/2014 | Li | ........................ | G01R 21/06 |
| | | | | 363/37 |
| 2014/0354074 A1* | 12/2014 | Sadakata | ............. | H02M 1/4225 |
| | | | | 307/104 |
| 2015/0100183 A1* | 4/2015 | Youngquist | ............... | H02J 4/00 |
| | | | | 701/3 |
| 2015/0123568 A1* | 5/2015 | Yang | ................. | H05B 33/0812 |
| | | | | 315/297 |
| 2015/0138857 A1* | 5/2015 | Ye | ....................... | H02M 1/4225 |
| | | | | 363/89 |

OTHER PUBLICATIONS

El-Habrouk Met Al: "Active power filters: A review". IEE Proceedings: Electric Power Applicati, Institution of Electrical Engineers, GB, vol. 147. No. 5, Sep. 8, 2000 (Sep. 8, 2000), pp. 403-413, XP006014141,ISSN: 1350-2352. DOI:10.1049/IP-EPA:20000522* p. 410-p. 411.

* cited by examiner

DIGITALLY IMPLEMENTED RIPPLE DETECTOR

FIELD

The present disclosure relates to a system for estimating a ripple signal from a signal including ripple, low frequency and DC components.

BACKGROUND

Rectifiers are used in power supply circuits in order to convert an alternating current (AC) signal to a direct current (DC) signal. Some rectifiers may generate a signal having a DC component and a ripple component based on the AC signal. Additionally, noise having a lower frequency than the ripple component may be included with the signal output by the rectifier. Some electronics, such as sensitive aircraft equipment, may not respond properly to a signal having ripple and noise (low frequency) components superimposed on a DC component. Accordingly, it is desirable to obtain an accurate estimate of the ripple component so that it can be either removed from the rectifier output signal prior to being provided to electronics configured to receive a DC power signal or so that other appropriate action can be taken for downstream equipment protection.

SUMMARY

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

What is described is a system for estimating a ripple component of an input signal. The system includes a first module configured to remove a DC component from the input signal and output an alternating current (AC) signal that includes the ripple component and a low frequency component of the input signal. The system also includes a second module configured to determine a period and an amplitude of the AC signal and output an estimated ripple signal based on the period and the amplitude of the AC signal.

Also described is system for estimating a ripple component of an analog input signal. The system includes a first module configured to convert the analog input signal to a digital input signal, the analog input signal comprising the ripple component, a direct current (DC) component and a low frequency component. The system also includes a second module configured to remove the DC component from the digital input signal and output an alternating current (AC) signal including the ripple component and the low frequency component. The system also includes a third module configured to determine locations at which the AC signal has a zero-value, a maximum value of the AC signal and a minimum value of the AC signal. The system also includes a fourth module configured to determine an estimated ripple signal based on the locations at which the AC signal has zero-crossings, the maximum value of the AC signal and the minimum value of the AC signal.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration and their best mode. While these exemplary embodiments are described in sufficient detail to enable those skilled in the art to practice the disclosure, it should be understood that other embodiments may be realized and that electrical, logical, chemical and mechanical changes may be made without departing from the spirit and scope of the disclosure. Thus, the detailed description herein is presented for purposes of illustration only and not of limitation. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

Figure 1:
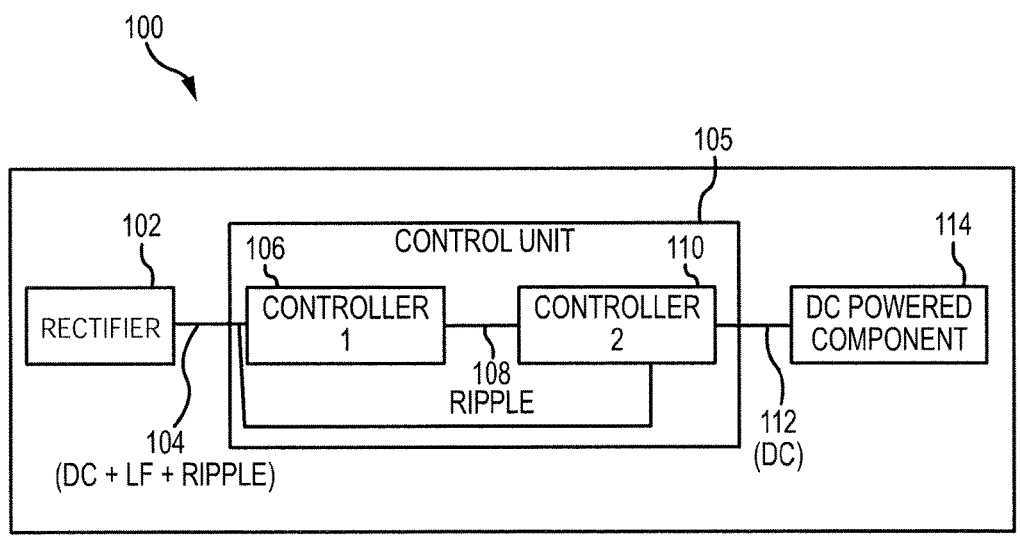
FIG. 1 illustrates a power system which may be used on an aircraft, in accordance with various embodiments.

With reference to FIG. 1, a power system 100 may include a rectifier 102, a controller unit 105 and a DC powered component 114. Power system 100 may be used on an aircraft or any other environment in which DC powered component 114 may reside. In various embodiments, the rectifier 102 may be replaced with any one or more components that output a signal having at least one property associated with direct current (DC) and at least one property associated with alternating current (AC). The rectifier 102 may be configured to convert an AC signal into a DC signal or to remove some AC components of a DC signal. The rectifier 102 may be a transformer rectifier unit (TRU) for generating a DC voltage signal. The rectifier 102 may receive a voltage signal that was previously generated from an AC power supply and output a signal 104 that includes a DC component, a low frequency (LF) component and a ripple component. The LF component of signal 104 may include noise from the rectifier 102 and/or other components. The ripple component may be an AC signal that was not rectified by the rectifier 102 and has a higher frequency than the LF component.

The DC powered component 114 may be any component configured to receive, to manage and/or to distribute a DC voltage signal. The DC powered component 114 may be sensitive to variations in a DC voltage supplied to it such that signal 104 having the DC, LF and ripple components may cause undesired results from the DC powered component 114. Thus, it is desirable for the ripple and/or LF components of signal 104 to at least be quantified and potentially removed prior to the signal being provided to the DC powered component 114. Controller unit 105 is configured to remove this ripple component (and, in various embodiments, the LF component) of signal 104 and output a signal 112 including an estimate of the DC component (and in some embodiments the LF component) of signal 104.

Controller unit 105 includes a first controller 106 and a second controller 110, each receiving signal 104. First controller 106 includes logic for separating the ripple component from the other components of signal 104 and outputting an estimated ripple signal 108 that is received by second controller 110. Second controller 110 may receive estimated ripple signal 108 and subtract estimated ripple signal 108 from signal 104 in order to remove the ripple component from signal 104. In various embodiments, second controller 110 includes logic for removing the LF portion of signal 104. Signal 112 (the estimated DC component) is output by second controller 110 to be received by DC powered component 114.

Figure 2:
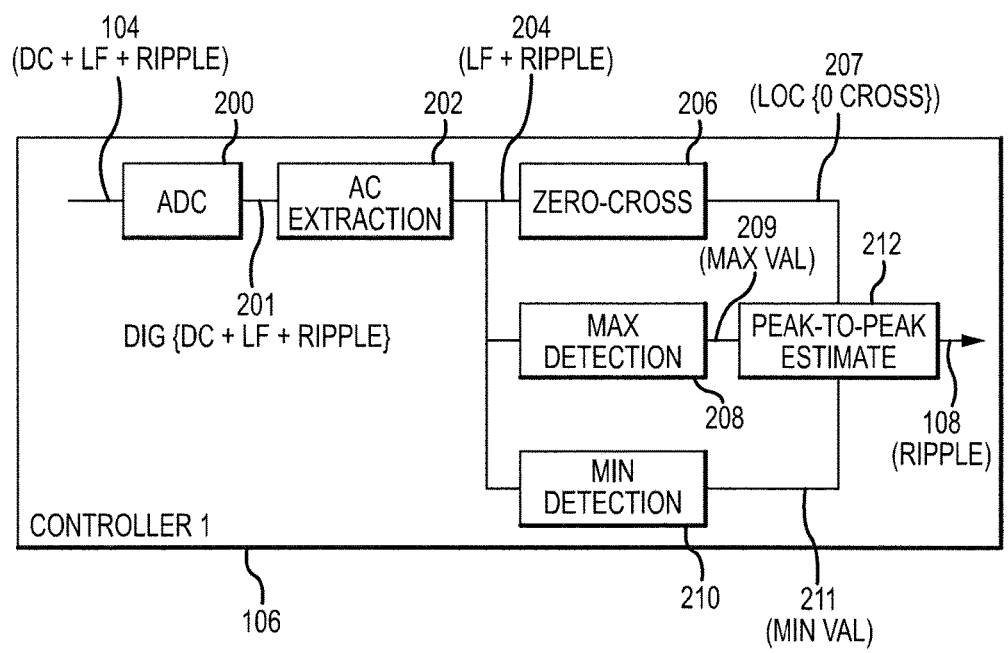
FIG. 2 illustrates a system for estimating a ripple component of a rectified signal, in accordance with various embodiments.

With reference now to FIG. 2, first controller 106 may include modules for separating estimated ripple signal 108 from signal 104. The modules may include an analog to digital converter module 200, an AC extraction module 202, a zero-cross module 206, a maximum (max) detection module 208, a minimum (min) detection module 210 and a peak-to-peak estimate module 212. The modules of first controller 106 may be implemented in one or more of the following: a central processing unit (CPU), an accelerated processing unit (APU), a digital signal processor (DSP), a field programmable gate array (FPGA), an application specific integrated circuit (ASIC) or the like.

Analog to digital converter module 200 may receive signal 104 including the DC, LF and ripple components and convert signal 104 into a digital signal 201 including digital representations of the DC, LF and ripple components.

AC extraction module 202 may receive digital signal 201 and extract the AC components (the ripple and/or LF components) from the digital signal 201. The AC extraction module 202 may then output a signal 204 that includes the ripple component (and in various embodiments the LF component) of digital signal 201. Signal 204 is then provided to zero-cross module 206, max detection module 208 and min detection module 210.

Because AC signals are periodic, signal 204 will have a period, a minimum value and a maximum value. The ripple component of signal 204 may have a higher frequency than the LF component of signal 204 so that the frequency of signal 204 may substantially correspond to the ripple component. Accordingly, a determined amplitude for each period of signal 204 may accurately represent the amplitude of the ripple component of signal 104.

Zero-cross module 206 may determine when (i.e., the locations in time) each time signal 204 crosses the zero line (i.e., each time the voltage changes between positive and negative voltage). Because the zero line is crossed twice for every period of an AC signal, the period of signal 204 can be measured by determining the time from a first zero-crossing to a third zero-crossing and the frequency can be determined based on the period. Zero-cross module 206 may output a cross signal 207 representative of the location of the zero-crossings, the period and/or the frequency of signal 204.

Max detection module 208 may determine the maximum value of signal 204 for every period and generate a max signal 209 that corresponds to the maximum value of signal 204 for each period. Min detection module 210 may determine the minimum value of signal 204 for each period and generate a min signal 211 that corresponds to the minimum value of signal 204 for each period. By combining the maximum value and the minimum value, a peak-to-peak value of the ripple component can be determined for every period.

Peak-to-peak estimate module 212 may receive cross signal 207, max signal 209 and min signal 211 and combine the determined zero-crossings (or the period or frequency), the determined maximum values of signal 204 and the determined minimum values of signal 204. This combination may result in a determined peak-to-peak amplitude and frequency. In various embodiments, only the determined maximum value or determined minimum value may be measured such that a peak-to-peak value may be determined based on one of the minimum value or maximum value. Because an AC signal can be represented by a period (or frequency) and an amplitude (peak-to-peak value), peak-to-peak estimate module 212 may output estimated ripple signal 108 that accurately represents the ripple component of signal 204. Similarly, because the frequency of the LF component is smaller than the frequency of the ripple component, the peak-to-peak value and the period will more accurately represent the ripple component than the combination of the ripple component and the LF component.

Figure 3A:
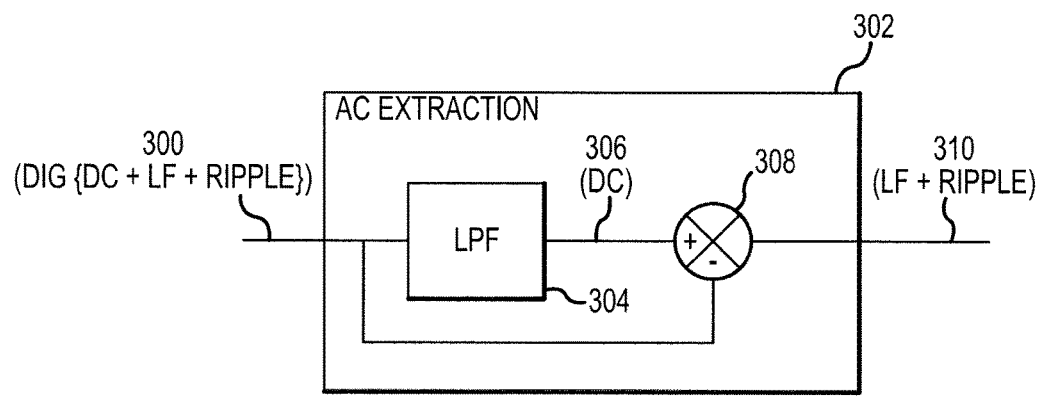
FIG. 3A illustrates a system for extracting alternating current components from a rectified signal, in accordance with various embodiments.

With reference now to FIG. 3A, an AC extraction module 302 may be one embodiment of AC extraction module 202 of FIG. 2. AC extraction module 302 may receive a signal 300 similar to digital signal 201 that includes a DC component, an LF component and a ripple component. A low pass filter 304 may receive signal 300 and remove AC components from signal 300. Low pass filter 304 may then generate a signal 306 that includes the DC component of the signal 300.

A subtractor 308 may receive signal 300 representing DC, LF and ripple components and signal 306 representing DC components and subtract signal 306 from signal 300. The subtractor 308 may output the result of the subtraction as a signal 310 that represents the ripple and LF components of the signal 300.

Figure 3B:
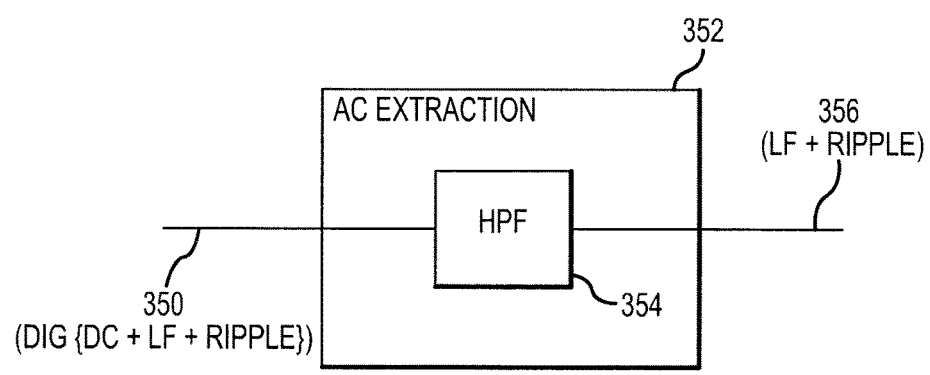
FIG. 3B illustrates another system for extracting alternating current components from a rectified signal, in accordance with various embodiments.

With reference to FIG. 3B, an AC extraction module 352 may be a further embodiment of AC extraction module 202. AC extraction module 352 may receive a signal 350 similar to digital signal 201 of FIG. 2 that includes a DC component, an LF component and a ripple component. AC extraction module 352 may include a high pass filter 354 for removing low frequency components of signal 350 so that the ripple component is passed and the DC component is not passed. The high pass filter 354 may then output a signal 356 that includes the passed ripple component. In various embodiments, high pass filter 354 may filter out only the DC component or it may filter out the DC and LF components.

Figure 4:
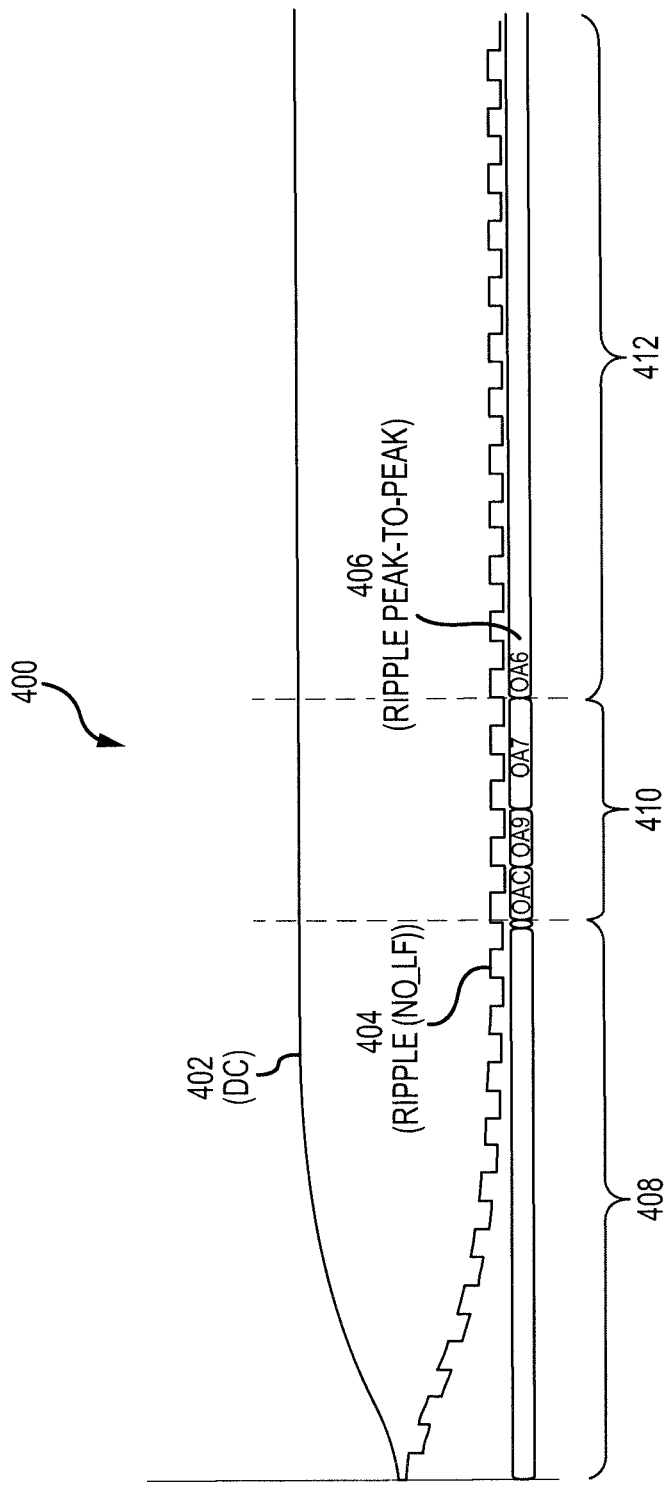
FIG. 4 illustrates results of a simulation using a system to estimate a ripple component of a signal having the ripple component and a direct current component, in accordance with various embodiments.

With reference now to FIG. 4, a graph 400 illustrates an estimated DC component 402 and an estimated ripple component 404 of a signal having DC and ripple components (but no LF component). Graph 400 represents results of a simulation using a controller having similar capabilities as first controller 106 of the signal having the DC component and the ripple component. Estimated ripple component 404 has been separated from estimated DC component 402 using a system similar to that of AC extraction module 202 of first controller 106. Because processing is performed on a digital representation of the signal, the system may require time to initialize, as can be seen in segment 408 of the graph 400. In segment 410, both estimated DC component 402 and estimated ripple component 404 are beginning to achieve a steady state as the AC extraction module is initializing. In segment 412, estimated DC component 402 and estimated ripple component 404 have achieved steady state.

A controller having similar capabilities as first controller 106 has been used to determine the peak-to-peak value of estimated ripple component 404, which may be represented by a peak-to-peak value indicator 406. At steady state, the peak-to-peak value of estimated ripple component 404 remains at a constant hexadecimal value of 0xA6. The determined peak-to-peak value 0xA6 of estimated ripple component 404 is the peak-to-peak value used as the input to the simulation.

Figure 5:
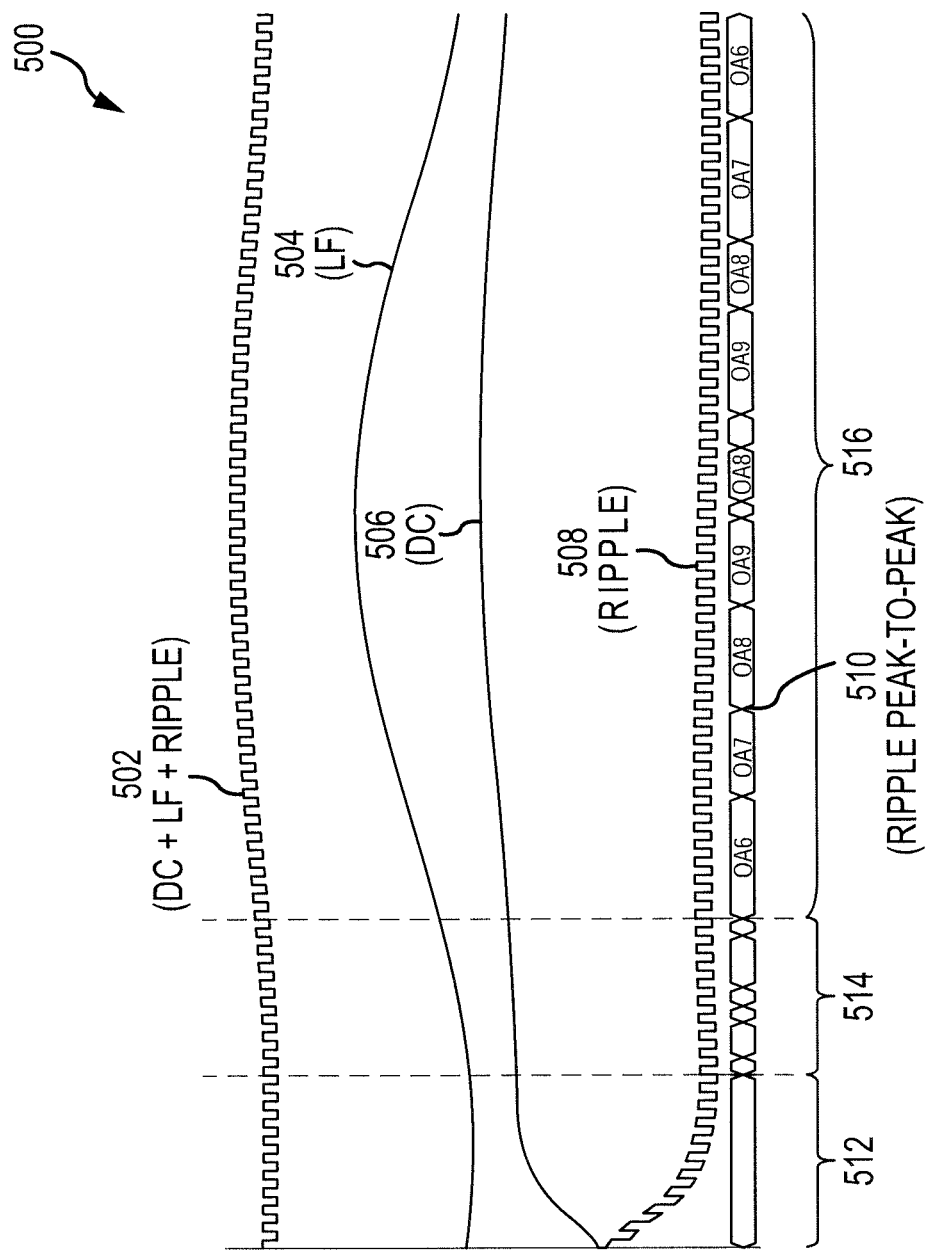
FIG. 5 illustrates results of a simulation using a system to estimate a ripple component of a signal having the ripple component, a direct current component and a low frequency component, in accordance with various embodiments.

With reference now to FIG. 5, a graph 500 illustrates a signal 502 that has been provided as an input to a controller having similar capabilities as first controller 106. Signal 502 includes the same DC component and ripple component as the input signal to the simulation shown in graph 400 as well as a newly introduced LF component. The graph 500 also illustrates an LF signal 504 that represents the LF component of signal 502, an estimated ripple signal 508 and an estimated DC signal 506 that were determined using modules similar to the modules discussed above with reference to FIG. 2. Similar to the simulation illustrated in FIG. 4, the simulation illustrated in FIG. 5 may require initialization because the system is processing a digital representation of signal 502. Accordingly, during a first segment 512 the simulation is beginning to initialize, during a second segment 514 the simulation is beginning to approach steady state and during a third segment 516 the simulation has achieved a steady state. As can be seen on the graph 500, estimated DC signal 506 and estimated ripple signal 508 include low frequency modulation caused by the LF signal 504.

Estimated ripple signal 508 may be determined by detecting the zero-crossings, the maximum values and the minimum values of the AC portions of signal 502. A peak-to-peak value indicator 510 represents the peak-to-peak value determined for every period of estimated ripple signal 508. As illustrated by the peak-to-peak value indicator 510 in the steady state third segment 516, the peak-to-peak values determined by the system range from hexadecimal value 0xA6 to hexadecimal value 0xA9. This indicates a three least significant bit (LSB) variation in the peak-to-peak ripple measurement, which is below a two percent (2%) variation. This variation is also significantly smaller than the amplitude of LF signal 504, illustrating that the present system can accurately estimate the ripple signal even when signal 502 includes the ripple component, the DC component and the LF component.

With reference now to FIGS. 4 and 5, the peak-to-peak values represented by the peak-to-peak value indicator 406 of the ripple signal that is not modulated by an LF component and the peak-to-peak value indicator 505 of the ripple signal that is modulated by the LF component are similar. The largest difference between the peak-to-peak value indicator 406 and the peak-to-peak value indicator 505 is less than 2% difference. In that regard, a system such as the first controller 106 can accurately estimate the value of a ripple component of a signal having a DC component, an LF component and a ripple component.

Figure 6:
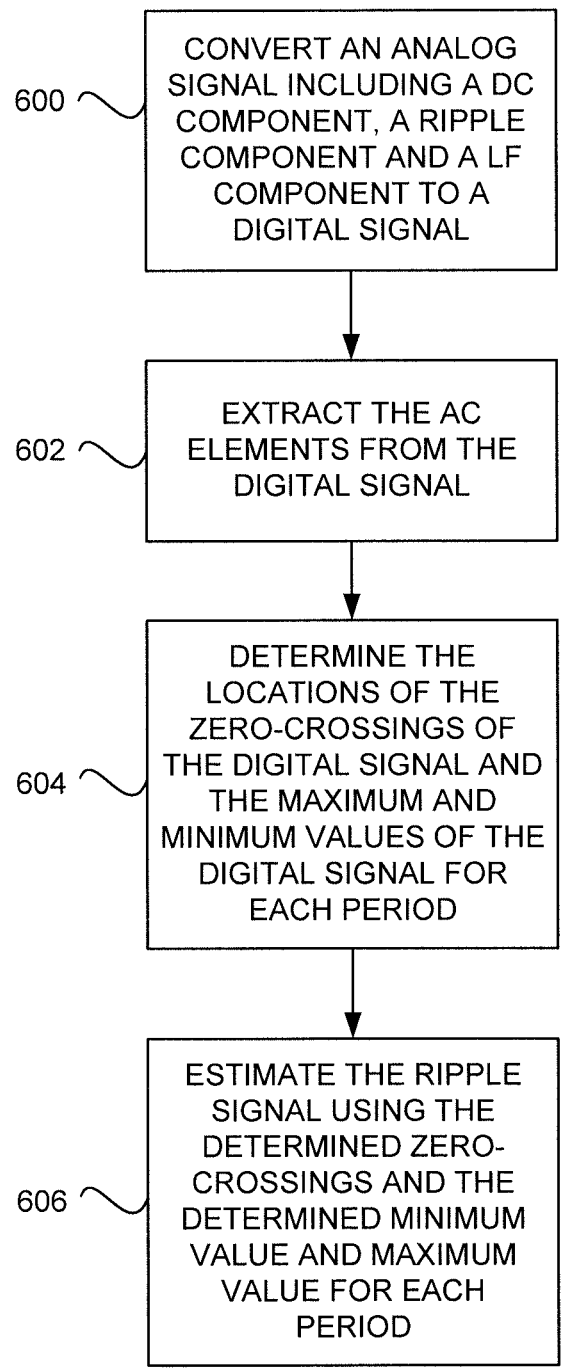
FIG. 6 illustrates a method to be performed using a controller for estimating a ripple component of a signal having the ripple component, a direct current component and a low frequency component, in accordance with various embodiments.

With reference to FIG. 6, a method to be performed by a controller similar to first controller 106 begins in block 600 in which the controller may convert an analog signal having a DC component, a ripple component and an LF component to a digital signal. This conversion may be performed using an analog to digital converter (ADC) or any other conversion algorithm/mechanism.

In block 602, the controller may extract the AC elements including the ripple and LF components from the digital signal. The AC elements may be extracted using an AC extraction module similar to AC extraction module 302, AC extraction module 352 or any other method of extracting AC components from the digital signal.

In block 604, the controller may determine the locations of the zero-crossings of the digital signal and use them to determine a period and frequency of the signal. The controller may also determine the maximum values and minimum values of the signal for each period.

In block 606, the controller may estimate the ripple component (which may include at least some of the LF component) using the determined zero-crossings and the determined minimum and maximum values for each period. Because an AC signal may be represented by a frequency and an amplitude, the ripple component may be represented using the determined period and peak-to-peak values.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods and apparatus are provided herein. In the detailed description herein, references to "one embodiment", "an embodiment", "various embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f) unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A power system comprising:
   a rectifier that outputs an analog input signal;
   a first controller comprising:
      an analog to digital converter module that receives the analog input signal into a digital input signal comprising a direct current (DC) component, a low frequency component and a ripple component;
      a first system module having low pass filter and configured to remove the DC component from the digital input signal and output digital alternating current (AC) signal that includes the ripple component and the low frequency component of the digital input signal, the low frequency component having a frequency that is less than a ripple frequency of the ripple component and greater than a DC frequency of the DC component;
      a second system module having:
         a peak-to-peak estimate module,
         a zero cross module configured to determine locations in which a value of the digital AC signal is zero and output a zero cross signal to the peak-to-peak estimate module,
         a max detection module configured to determine a maximum value of the digital AC signal for a period of the digital AC signal and output a max signal to the peak-to-peak estimate module,
         a min detection module configured to determine a minimum value of the digital AC signal for the period of the digital AC signal and output a min signal to the peak-to-peak estimate module,
         wherein the peak-to-peak estimate module is configured to determine the period and a peak-to-peak value of the digital AC signal having the ripple component and the low frequency component based on the received zero cross signal, the max signal, and the min signal, and wherein the peak-to-peak estimate module is configured to output an estimated digital ripple signal based on the period and the peak-to-peak value of the digital AC signal;
   a second controller programmed to receive the estimated digital ripple signal and the digital input signal as a second controller input signal and output an estimated digital output signal comprising the low frequency component and the DC component, by subtracting the estimated digital ripple signal from the digital input signal; and
   a DC powered component configured to receive the estimated digital output signal.

2. The power system of claim 1, wherein the rectifier is a transformer rectifier unit.

3. The power system of claim 1, wherein the analog input signal is configured for use with a component of an aircraft.

4. A power system comprising:
   a rectifier that outputs an analog input signal;
   a first controller comprising:
      a first system module configured to convert the analog input signal to a digital input signal, the digital input signal comprising a ripple component, a direct current (DC) component and a low frequency component having a frequency that is less than a ripple frequency of the ripple component and greater than a DC frequency of the DC component
      a second system module having a high pass filter and configured to remove the DC component from the digital input signal and output a digital alternating current (AC) signal including the ripple component and the low frequency component;
      a third system module having:
         a peak-to-peak estimate module,
         a zero cross module configured to determine locations in which a value of the digital AC signal is zero and output a zero cross signal to the peak-to-peak estimate module,
         a max detection module configured to determine a maximum value of the digital AC signal for a period of the digital AC signal and out a max signal to the peak-to-peak estimate module,
         a min detection module configured to determine a minimum value of the digital AC signal for the period of the digital AC signal and output a min signal to the peak-to-peak estimate module, and
         wherein the peak-to-peak estimate module is configured to determine the period and a peak-to-peak value of the digital AC signal having the ripple component and the low frequency component based on the received zero cross signal, the max signal, and the min signal, and wherein the peak-to-peak estimate module is configured to output an estimated digital ripple signal based on the period and the peak-to-peak value of the digital AC signal;
   a second controller programmed to receive the estimated digital ripple signal and the analog input signal as a second controller input signal and output an estimated digital DC signal, by subtracting the estimated digital ripple signal from the digital input signal; and
   a DC powered component configured to receive the estimated digital DC signal.

5. The power system of claim 4, wherein the rectifier is a transformer rectifier unit.

* * * * *